(12) United States Patent
Wong et al.

(10) Patent No.: US 11,637,100 B2
(45) Date of Patent: Apr. 25, 2023

(54) SEMICONDUCTOR DEVICE HAVING CAPACITOR AND RESISTOR AND A METHOD OF FORMING THE SAME

(71) Applicant: GLOBALFOUNDRIES Singapore Pte. Ltd., Singapore (SG)

(72) Inventors: Qiying Wong, Singapore (SG); Handoko Linewih, Singapore (SG); Yudi Setiawan, Singapore (SG); Chengang Feng, Singapore (SG); Siow Lee Chwa, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/400,095

(22) Filed: Aug. 11, 2021

(65) Prior Publication Data

US 2023/0046455 A1 Feb. 16, 2023

(51) Int. Cl.
*H01L 27/06* (2006.01)
*H01L 23/522* (2006.01)
*H01L 49/02* (2006.01)
*H01L 27/01* (2006.01)

(52) U.S. Cl.
CPC ...... *H01L 27/0629* (2013.01); *H01L 23/5223* (2013.01); *H01L 23/5226* (2013.01); *H01L 23/5228* (2013.01); *H01L 28/24* (2013.01); *H01L 28/75* (2013.01); *H01L 27/016* (2013.01)

(58) Field of Classification Search
CPC ............. H01L 23/5223; H01L 23/5226; H01L 23/5228; H01L 27/0629; H01L 28/24; H01L 28/75
USPC ......................................................... 257/532
See application file for complete search history.

(56) References Cited

U.S. PATENT DOCUMENTS

| | | | |
|---|---|---|---|
| 6,365,480 B1 | 4/2002 | Huppert et al. | |
| 6,730,573 B1 | 5/2004 | Ng et al. | |
| 8,754,501 B2 | 6/2014 | Khan et al. | |
| 8,803,287 B2 | 8/2014 | Dirnecker et al. | |
| 8,907,446 B2 | 12/2014 | Summerfelt et al. | |
| 9,064,719 B1 | 6/2015 | Zhou et al. | |
| 10,290,701 B1 * | 5/2019 | Chang | H01L 23/5223 |
| 10,840,322 B2 | 11/2020 | Kande et al. | |
| 2003/0017699 A1 * | 1/2003 | Zurcher | H01L 27/0688 257/E21.582 |
| 2012/0126369 A1 | 5/2012 | Lin et al. | |
| 2015/0294936 A1 * | 10/2015 | Shen | H01L 21/76877 257/532 |
| 2021/0118981 A1 * | 4/2021 | Tsai | H01L 23/528 |

FOREIGN PATENT DOCUMENTS

JP 3987847 B2 10/2007

\* cited by examiner

*Primary Examiner* — Thinh T Nguyen
(74) *Attorney, Agent, or Firm* — Anthony Canale (57) ABSTRACT

The present disclosure generally relates to a semiconductor device having a capacitor and a resistor and a method of forming the same. More particularly, the present disclosure relates to a metal-insulator-metal (MIM) capacitor and a thin film resistor (TFR) formed in a back end of line portion of an integrated circuit (IC) chip.

20 Claims, 5 Drawing Sheets

SEMICONDUCTOR DEVICE HAVING CAPACITOR AND RESISTOR AND A METHOD OF FORMING THE SAME

FIELD OF THE INVENTION

The disclosed subject matter relates generally to a semiconductor device having a capacitor and a resistor and a method of forming the same. More particularly, the present disclosure relates to a metal-insulator-metal (MIM) capacitor and a thin film resistor (TFR) formed in a back end of line (BEOL) portion of an integrated circuit (IC) chip.

BACKGROUND

The semiconductor industry's drive for higher density, higher performance, lower-cost devices, and the implementation of nanometer-scale process nodes have resulted in the development of various IC chips with increasingly smaller and more complex circuits. An IC chip can include numerous device components, such as, but not limited to, memory cells, transistors, capacitors, and optical/photonic components.

In many applications, passive circuit components such as capacitors and resistors can be formed in the BEOL portion of the IC chip. A MIM capacitor is an example of a capacitor that has an insulator sandwiched between two metal plates. A thin film resistor is an example of a resistor that employs a thin film with resistive properties. Formation of these components can involve several photolithographic processes, such as deposition, use of numerous masks, application of photoresist, etching, wet and dry cleaning, and wafer handling. These processes may incur high manufacturing costs.

SUMMARY

In an aspect of the present disclosure, there is provided a semiconductor device including a first inter-metal region above a substrate, a second inter-metal region above the first inter-metal region, and a capacitor. The capacitor includes a metal layer in the first inter-metal region, a conductive layer in the second inter-metal region, the conductive layer is above the metal layer, a first dielectric layer between the metal layer and the conductive layer, a conductive film in the second inter-metal region, the conductive film has a first horizontal section above the conductive layer and a second horizontal section laterally adjacent to the conductive layer, a second dielectric layer between the conductive layer and the conductive film. The semiconductor device also includes a first interconnect via disposed upon the metal layer, a second interconnect via disposed upon the conductive layer, and a third interconnect via disposed upon the second horizontal section of the conductive film.

In another aspect of the present disclosure, there is provided a semiconductor device including a first inter-metal region above a substrate, a second inter-metal region above the first inter-metal region, a capacitor, and a resistor. The capacitor includes a metal layer in the first inter-metal region, a conductive layer in the second inter-metal region, the conductive layer is above the metal layer, a first dielectric layer between the metal layer and the conductive layer, a conductive film in the second inter-metal region, the conductive film has a first horizontal section above the conductive layer and a second horizontal section laterally adjacent to the conductive layer, and a second dielectric layer between the conductive layer and the conductive film. The resistor includes a resistive metallic film in the second inter-metal region, in which the resistive metallic film of the resistor and the conductive film of the capacitor are a same material.

In yet another aspect of the present disclosure, there is provided a method of forming a capacitor and a resistor in a semiconductor device by providing a first inter-metal region above a substrate, the first inter-metal region having a dielectric material, forming a metal layer in the first inter-metal region, forming a first dielectric layer on the metal layer, forming a conductive layer on the first dielectric layer, forming a second dielectric layer on the conductive layer, forming a conductive film on the second dielectric layer, the conductive film has a first horizontal section above the conductive layer and a second horizontal section laterally adjacent to the conductive layer, forming a resistive metallic film above the dielectric material in the first inter-metal region, in which the resistive metallic film and the conductive film are made of a same material, and forming a second inter-metal region above the first inter-metal region, in which the conductive layer, the conductive film, and the resistive metallic film are in the second inter-metal region.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
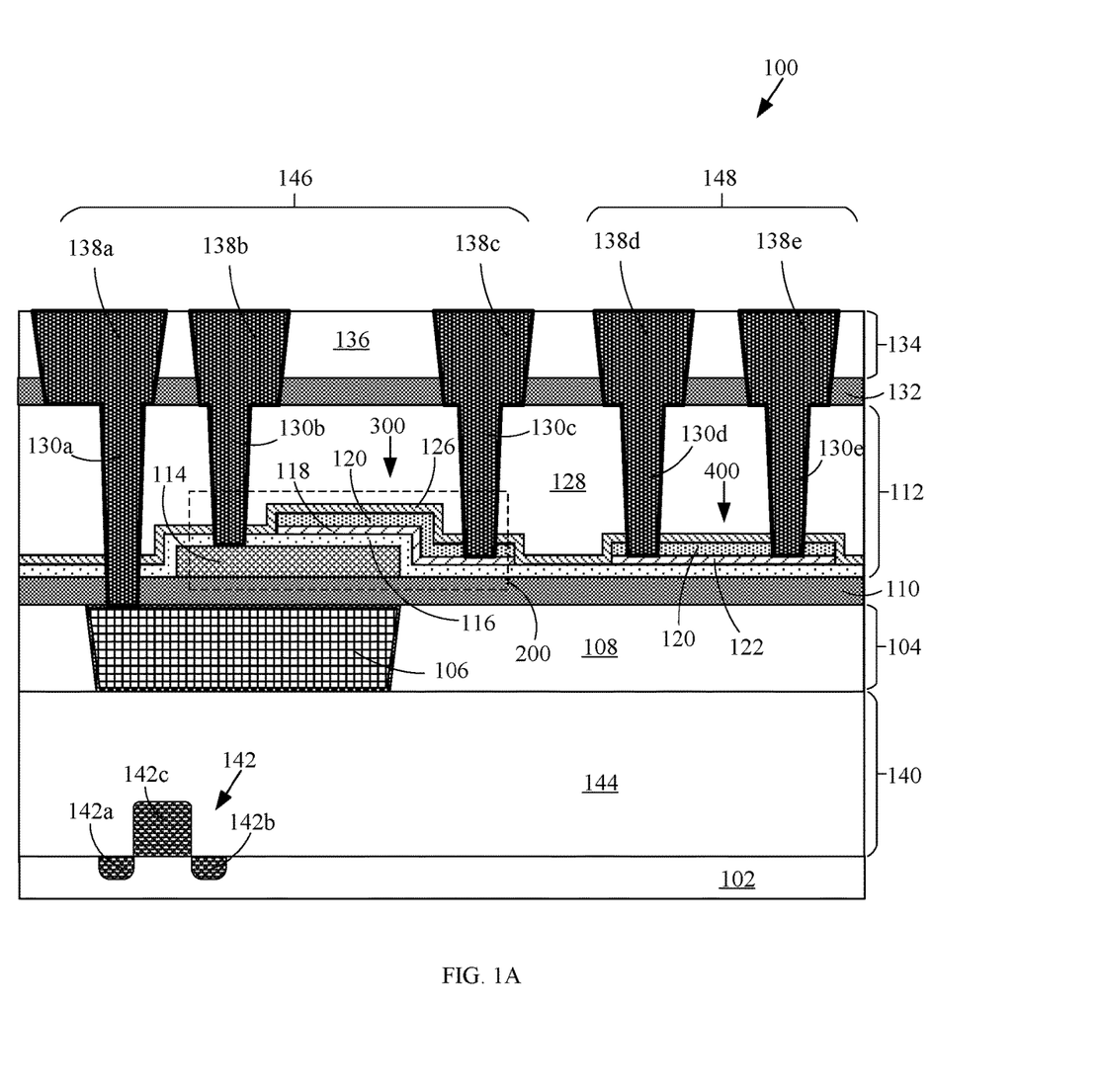
FIG. 1A is a cross-sectional view of an example of a semiconductor device having a capacitor and a resistor.
Figure 1B:
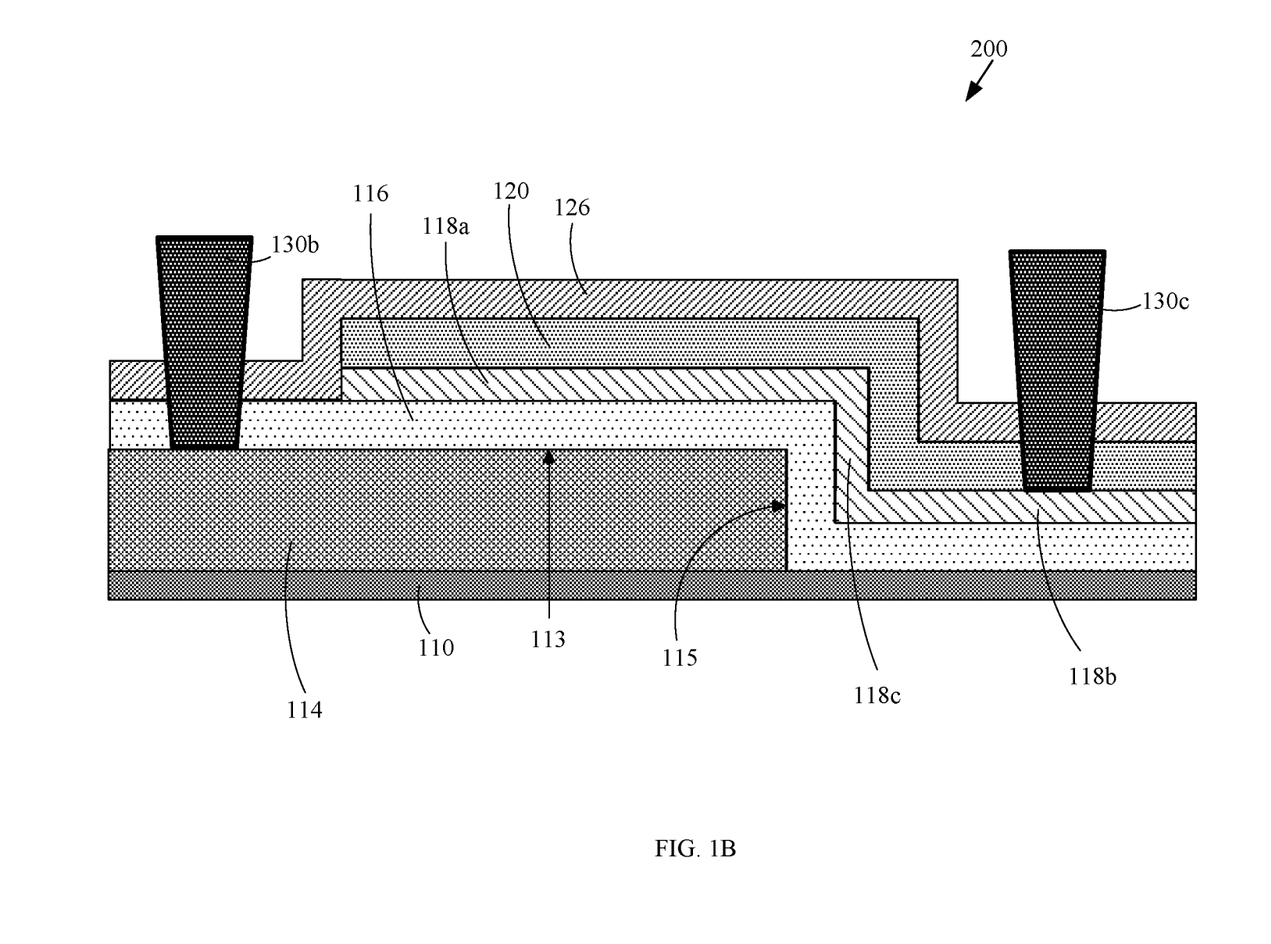
FIG. 1B is an enlarged cross-sectional view of a portion of the capacitor in the semiconductor device shown in FIG. 1A.

FIG. 1A illustrates an example of a semiconductor device 100 and FIG. 1B illustrates an enlarged portion 200 of a capacitor in the exemplary semiconductor device 100 in FIG. 1A. Referring to FIG. 1A and FIG. 1B, a semiconductor device 100 may include a substrate 102, a first inter-metal region 104 above the substrate 102, a second inter-metal region 112 above the first inter-metal region 104, a capacitor 300, and a resistor 400. The capacitor 300 may be located in a capacitor region 146 of the semiconductor device 100 while the resistor 400 may be located in a resistor region 148 of the semiconductor device 100. Although not shown in FIG. 1A, in some embodiments, other IC components may be positioned between the capacitor region 146 and the resistor region 148. Such components may include, but are not limited to, a memory device (e.g., resistive random access memory structure, magnetic random access memory structure, etc.), or an inductor, The capacitor 300 includes a metal layer 106 in the first inter-metal region 104, a conductive layer 114 above the metal layer 106, a first dielectric layer 110 between the metal layer 106 and the conductive layer 114, a conductive film 118 above the conductive layer 114, and a second dielectric layer 116 between the conductive layer 114 and the conductive film 118. The conductive layer 114 and the conductive film 118 are in the second inter-metal region 112. In some embodiments, the capacitor 300 may be referred to as a metal-insulator-metal (MIM) capacitor. The resistor 400 includes a resistive metallic film 122 in the second inter-metal region 112. The resistive metallic film 122 of the resistor 400 and the conductive film 118 of the capacitor 300 are of a same material. In some embodiments, the resistor 400 may be referred to as a thin film resistor.

The first inter-metal region 104 may include a dielectric material 108. The dielectric material 108 may include, but is not limited to, silicon dioxide, tetraethyl orthosilicate (TEOS), or a material having a chemical composition of $SiC_xO_yH_z$, wherein x, y, and z are in stoichiometric ratio. The term "inter-metal region" as used herein may refer to a "metallization level" or an "inter-level dielectric (ILD)" in a BEOL processing of an IC chip that contains various interconnect features (e.g., interconnect vias, conductive lines, contact structures, etc.).

The metal layer 106 may function as a conductive line that enables routing of electrical signals as well as a bottom electrode of the capacitor 300. The metal layer 106 may include conductive materials, such as tantalum (Ta), tungsten (W), ruthenium (Ru), cobalt (Co), copper (Cu), titanium (Ti), nickel (Ni), platinum (Pt), aluminum (Al), or an alloy thereof. Preferably, the metal layer 106 may include copper.

The first dielectric layer 110 may be disposed upon the metal layer 106 and the dielectric material 108 in the first inter-metal region 104. The first dielectric layer 110 may include, but is not limited to, silicon dioxide ($SiO_2$), silicon oxynitride (SiON), silicon nitride (SiN), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75. The first dielectric layer 110 may have a thickness in the range of about 50 nm to about 80 nm.

The conductive layer 114 may be disposed upon the first dielectric layer 110. The conductive layer 114 may have a side surface 115 and an upper surface 113. In some embodiments, the conductive layer 114 may overlap with an upper surface of the metal layer 106. The conductive layer 114 may function as a middle electrode of the capacitor 300 and may include a material capable of conducting electricity, such as, but is not limited to, metallic alloys, ceramic-metal (cermet) material, silicon-chromium, nickel-chromium, aluminum, titanium, titanium nitride, tantalum, or tantalum nitride. The conductive layer 114 may have a thickness in the range of about 70 nm to about 110 nm.

A second dielectric layer 116 may be disposed upon the conductive layer 114. In some embodiments, the second dielectric layer 116 may conform to side surfaces and an upper surface of the conductive layer 114. The second dielectric layer 116 may additionally extend to be disposed upon the first dielectric layer 110. The second dielectric layer 116 may include, but is not limited to, silicon dioxide ($SiO_2$), silicon oxynitride (SiON), silicon nitride (SiN), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75. The second dielectric layer 116 may have a thickness in the range of about 50 nm to about 80 nm.

The conductive film 118 may be disposed upon the second dielectric layer 116. The conductive film 118 may function as a top electrode of the capacitor 300. As shown in FIG. 1B, the conductive film 118 has a first horizontal section 118a, a second horizontal section 118b, and a vertical section 118c. The first horizontal section 118a of the conductive film 118 is integrally joined to the second horizontal section 118b of the conductive film 118 by the vertical section 118c of the conductive film 118. The first horizontal section 118a is above the conductive layer 114, and the second horizontal section 118b is laterally adjacent to the conductive layer 114. The vertical section 118c of the conductive film 118 may overlap with the side surface 115 of the conductive layer 114. The first horizontal section 118a of the conductive film 118 may overlap with the upper surface 113 of the conductive layer 114.

The second horizontal section 118b of the conductive film 118 may be above the dielectric material 108 in the first inter-metal region 104. The first dielectric layer 110 and second dielectric layer 116 may extend to lie below the second horizontal section 118b of the conductive film 118. In some embodiments, the metal layer 106 does not extend to lie below the second horizontal section 118b of the conductive film 118 to avoid an electrical short with the conductive film 118.

The conductive film 118 may have a thickness in the range of about 2 nm to about 10 nm, and preferably, about 3 nm to about 5 nm. The conductive film 118 may include a metallic material or a ceramic-metallic (cermet) material. Examples of the metallic material or the ceramic-metallic material may include, but are not limited to, silicon-chromium (SiCr) or its alloys such as SiCCr, SiCOCr, or nickel-chromium (NiCr) or its alloys such as NiCrSi, NiCrSiAl, NiCrSiAlTa. As described herein, the resistive metallic film 122 may be the same material as the conductive film 118. The resistive metallic film 122 may also have a same thickness as the conductive film 118. The conductive film 118 and the resistive metallic film 122 may provide a resistance value in the range of about 100 ohm to about 1000 ohm and have a preferred temperature coefficient of resistance (TCR) in the range of about −50 to 50 ppm/° C.

As shown in FIG. 1A, the first dielectric layer 110 and the second dielectric layer 116 may extend to lie below the resistive metallic film 122. In particular, the resistive metallic film 122 may be disposed upon the second dielectric layer 116. The resistive metallic film 122 may also be positioned above the dielectric material 108 in the first inter-metal region 104. Preferably, the resistive metallic film 122 may not be positioned directly above any metal layer in the first inter-metal region 104. For example, the resistive metallic film 122 may be positioned above and laterally displaced from the metal layer 106 so that the metal layer 106 does not extend to lie below the resistive metallic film 122. The presence of any metal layer directly below the resistive metallic film 122 may cause unwanted parasitic capacitance to the resistor 400, which can otherwise compromise the resistive properties of the resistive metallic film 122. The positioning of the resistive metallic film 122 above the dielectric material 108 in the first inter-metal region 104 may therefore avoid this.

A third dielectric layer 120 may be disposed upon the conductive film 118 and the resistive metallic film 122. The third dielectric layer 120 may function as a mask layer for the formation of the conductive film 118 and the resistive metallic film 122. The third dielectric layer 120 may include a material such as, but not limited to, silicon nitride (SiN), silicon dioxide ($SiO_2$), silicon oxynitride (SiON), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75. Preferably, the third dielectric layer 120 may be a low temperature silicon nitride film.

A fourth dielectric layer 126 may be disposed over the capacitor 300 and the resistor 400. In particular, the fourth dielectric layer 126 may be disposed on the third dielectric layer 120 and the second dielectric layer 116. The fourth dielectric layer 126 may be referred to as a capping layer and may function as a protective barrier. The fourth dielectric layer 126 may include a material such as, but is not limited to, silicon dioxide ($SiO_2$), silicon oxynitride (SiON), silicon nitride (SiN), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75. The third dielectric layer 120 and the fourth dielectric layer 126 may be in the second inter-metal region 112. The third dielectric layer 120 may have a higher porosity and a lower density as compared to those of the fourth dielectric layer 126.

The second inter-metal region 112 may include a dielectric material 128. The dielectric material 128 may be formed upon the fourth dielectric layer 126. The dielectric material 128 may include, but is not limited to, silicon dioxide, tetraethyl orthosilicate (TEOS), or a material having a chemical composition of $SiC_xO_yH_z$, wherein x, y, and z are in stoichiometric ratio.

In some embodiments, the third dielectric layer 120 may have a higher etch rate than the fourth dielectric layer 126 and the dielectric material 128 in the second inter-metal region 112. In particular, the third dielectric layer 120 may be more porous in material composition than the fourth dielectric layer 126 and the dielectric material 128, so that the third dielectric layer 120 can be etched away faster than the fourth dielectric layer 126 and the dielectric material 128, by either a dry etch or a wet etch process.

A third inter-metal region 134 may be positioned above the second inter-metal region 112. A fifth dielectric layer 132 may be disposed between the second inter-metal region 112 and the third inter-metal region 134. The fifth dielectric layer 132 may serve as an etch stop layer and may include, but is not limited to, silicon nitride (SiN), silicon dioxide ($SiO_2$), silicon oxynitride (SiON), Nitrogen doped silicon carbide (SiCN), $SiC_xH_z$ (i.e., BLoK™), or $SiN_wC_xH_z$ (i.e., NBLoK™) wherein each of w, x, y, and z independently has a value greater than 0 and less than 0.75. The third inter-metal region 134 may include a dielectric material 136 and conductive lines 138a, 138b, 138c, 138d, 138e. The dielectric material 136 in the third inter-metal region 134 may include, but is not limited to, silicon dioxide, tetraethyl orthosilicate (TEOS), or a material having a chemical composition of $SiC_xO_yH_z$, wherein x, y, and z are in stoichiometric ratio.

Interconnect vias 130a, 130b, 130c, 130d, 130e may be formed on the capacitor 300 and the resistor 400 to provide electrical connection to the respective conductive lines 138a, 138b, 138c, 138d, 138e. For example, a first interconnect via 130a may be disposed upon the metal layer 106, a second interconnect via 130b may be disposed upon the conductive layer 114, and a third interconnect via 130c may be disposed upon the second horizontal section 118b of the conductive film 118. In particular, the second interconnect via 130b may be disposed upon the portion of the upper surface 113 of the conductive layer 114 that does not overlap with the first horizontal section 118a of the conductive film 118. A fourth interconnect via 130d and a fifth interconnect via 130e may be disposed upon the resistive metallic film 122.

The interconnect features such as the interconnect vias 130a, 130b, 130c, 130d, 130e and the conductive lines 138a, 138b, 138c, 138d, 138e may be made of conductive materials, such as tungsten (W), ruthenium (Ru), cobalt (Co), copper (Cu), titanium (Ti), nickel (Ni), platinum (Pt), aluminum (Al), or an alloy thereof. Although not shown in the accompanying drawings, in some embodiments, each of the interconnect vias 130, the conductive lines 138, and the metal layer 106 may additionally include a conductive barrier liner (not shown) that surrounds side surfaces and a lower surface of the respective conductive material in the interconnect vias 130, the conductive lines 138, and the metal layer 106. The conductive barrier liner may serve to prevent or reduce the diffusion of atoms into or out of the conductive material in the interconnect features, whilst allowing electrical conduction therein. Exemplary materials for the conductive barrier liner may include, but are not limited to, titanium, titanium nitride, tantalum, or tantalum nitride.

Various active components may be formed on the substrate 102. Examples of active components may include diodes (e.g., single-photon avalanche diode) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT). These active components may be formed in the front end of line portion of an IC chip. For example, a transistor 142 may be formed on the substrate 102, the transistor 142 having a source 142a, a drain 142b, and a gate 142c arranged between the source 142a and the drain 142b.

The capacitor 300 and the resistor 400 may be formed in the BEOL portion of the IC chip. For example, one or more inter-metal regions 140 may be positioned between the first inter-metal region 104 and the substrate 102. The inter-metal region 140 may include a dielectric material 144. The dielectric material 144 may include, but is not limited to, silicon dioxide, tetraethyl orthosilicate (TEOS), or a material having a chemical composition of $SiC_xO_yH_z$, wherein x, y, and z are in stoichiometric ratio. Although not shown in the accompanying drawings, the transistor 142 may be connected to the capacitor 300 and the resistor 400 in the semiconductor device 100 through various interconnect features.

Advantageously, by providing the conductive film 118 with the same thickness and the same material as the resistive metallic film 122, the conductive film 118 may reduce the tensile stress acting upon the underlying second dielectric layer 116. More advantageously, the capacitor 300 having a bottom electrode (e.g., metal layer 106), a middle electrode (e.g., conductive layer 114), and a top electrode (e.g., conductive film 118) may provide two times higher capacitance density as compared to a capacitor with only two electrodes.

Advantageously, the positioning of the second horizontal section 118b of the conductive film 118 to be laterally adjacent to the conductive layer 114 may avoid electrical shorts between the interconnect via 130c, and the underlying conductive layer 114, or between the conductive film 118 and the underlying conductive layer 114. As a comparative example, if the third interconnect via 130c had been disposed on the first horizontal section 118a of the conductive film 118 instead, then in situations where the formation of the interconnect via 130c may inadvertently penetrate through the conductive film 118, the interconnect via 130c may contact the conductive layer 114, thereby causing an electrical short. The electrical short can be avoided by forming the interconnect via 130c on the second horizontal section 118b.

Similarly, the positioning of the resistive metallic film 122 above the dielectric material 108 and laterally displaced from any metal layers in the first inter-metal region 104 may avoid electrical shorts, for example, between the interconnect vias 130d, 130e, and any metal layers in the first inter-metal region that is directly below the resistive metallic film 122, or between the resistive metallic film 122 and any metal layers in the first inter-metal region. As a comparative example, if the resistive metallic film 122 had been positioned directly above a metal layer in the first inter-metal region 104, then in situations where the formation of the fourth interconnect via 130d and the fifth interconnect via 130e may inadvertently penetrate through the resistive metallic film 122, the vias 130d, 130e may contact any metal layer in the first inter-metal region 104 that is directly below the resistive metallic film 122, thereby causing an electrical short. The electrical short can be avoided by positioning the resistive metallic film 122 above the dielectric material 108 in the first inter-metal region 104.

FIGS. 2 through 9 show a set of steps that may be used to form a capacitor and a resistor in a semiconductor device.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 2:
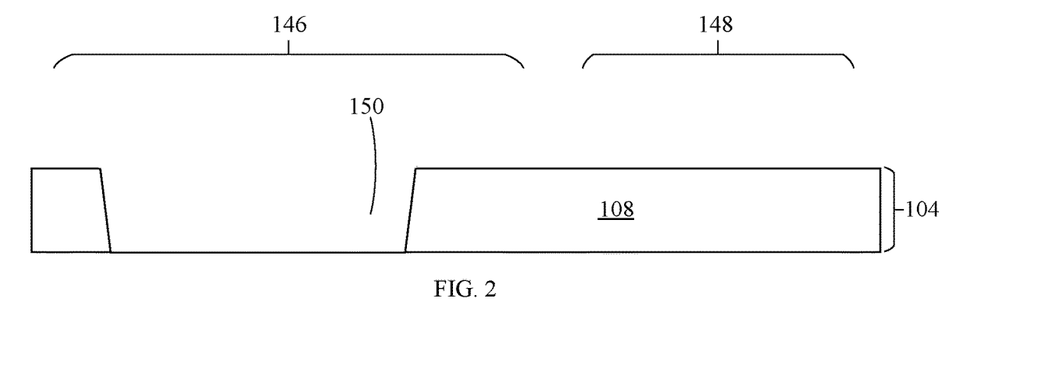
FIG. 2 to FIG. 9 are cross-sectional views depicting an exemplary set of steps for forming a capacitor and a resistor in a semiconductor device.

Referring to FIG. 2, a device structure for use in fabricating the semiconductor devices of the present disclosure is shown. The device structure may have a capacitor region 146 and a resistor region 148. The device structure provides a first inter-metal region 104 above a substrate (not shown). The first inter-metal region 104 may have a dielectric material 108. An opening 150 may be formed in the dielectric material 108 using the patterning techniques described herein. The opening 150 in the first inter-metal region 104 may be in the capacitor region 146 and may not be in the resistor region 148 (i.e., the dielectric material 108 in the resistor region 148 is not patterned).

Figure 3:
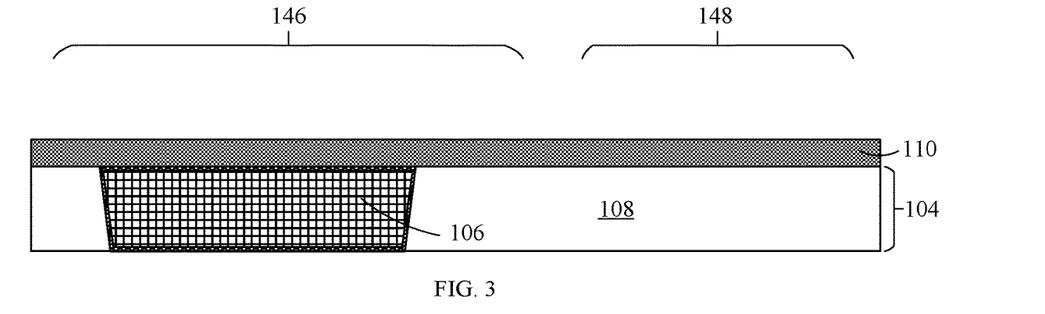

Referring to FIG. 3, a metal layer 106 may be formed in the opening 150 using the deposition techniques described herein. For example, the metal layer 106 may be formed using a damascene process. Thereafter, a first dielectric layer 110 may be formed in both the capacitor region 146 and the resistor region 148. For example, the first dielectric layer 110 may be formed on the metal layer 106 and the dielectric material 108 of the first inter-metal region 104 using the deposition techniques described herein.

Figure 4:
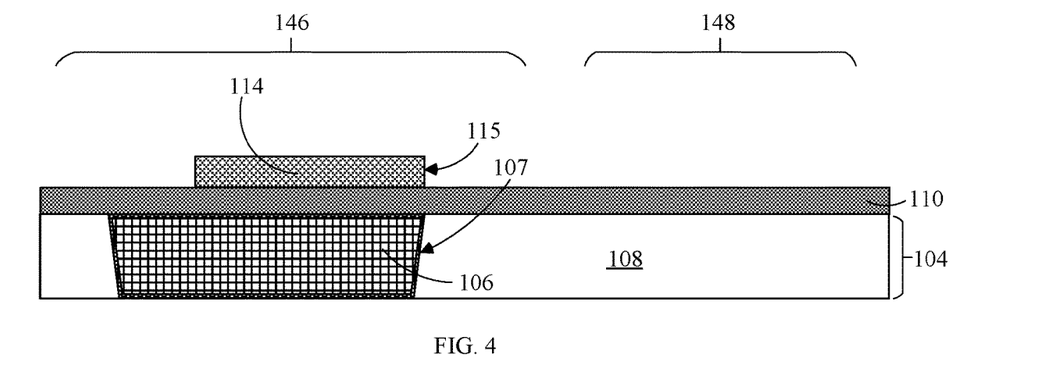

Referring to FIG. 4, a conductive layer 114 may be formed in the capacitor region 146. For example, the conductive layer 114 may be formed by depositing a layer of material using the deposition techniques described herein, followed by patterning the deposited material using the patterning techniques described herein. A mask layer may be used in the patterning process. The conductive layer 114 may be formed above the metal layer 106. In particular, the conductive layer 114 may be formed to overlap with the metal layer 106. In some embodiments, the conductive layer 114 may be formed with a side surface 115. The side surface 115 of the conductive layer 114 may be aligned with a side surface 107 of the metal layer 106. At this stage, the conductive layer 114 and the metal layer 106 may provide a "single" MIM capacitor with the first dielectric layer 110 therebetween.

Figure 5:
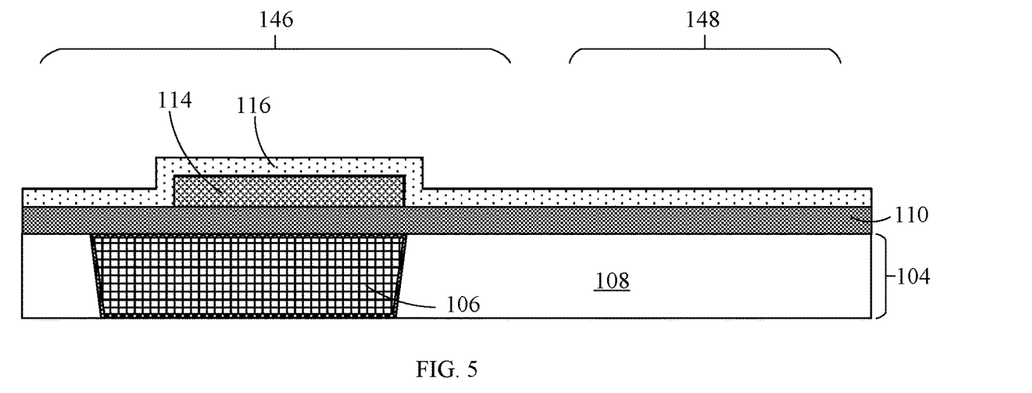

Referring to FIG. 5, a second dielectric layer 116 may be formed on the conductive layer 114 and the first dielectric layer 110 using the deposition techniques described herein. For example, the second dielectric layer 116 may be formed using a conformal deposition process, such as an ALD process or a highly conformal CVD process.

Figure 6:
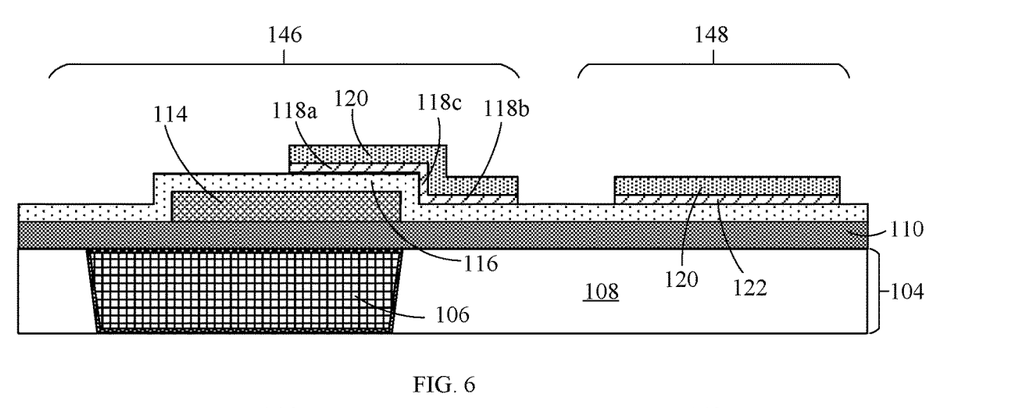

Referring to FIG. 6, a conductive film 118 and a resistive metallic film 122 may be formed on the second dielectric layer 116. The conductive film 118 and the resistive metallic film 122 may be formed simultaneously. For example, a film of material may be deposited on the second dielectric layer 116 using the deposition techniques described herein. Preferably, the film of material may be formed using a conformal deposition process.

A third dielectric layer 120 may be formed on the film of material using the deposition techniques described herein. Preferably, the third dielectric layer 120 may be deposited at a low temperature. The deposited third dielectric layer 120 may be patterned using the patterning techniques described herein to provide a patterned mask for subsequent patterning of the underlying film of material. As an example, the deposited film of material may be etched to form the conductive film 118 in the capacitor region 146 and the resistive metallic film 122 in the resistor region 148. Forming the conductive film 118 and the resistive metallic film 122 from a same material may offer an advantage of avoiding the use of an additional mask and associated patterning steps had the films 118, 122 been formed in separate processes.

As shown, the conductive film 118 is formed to have a first horizontal section 118a that is above the conductive layer 114, and a second horizontal section 118b that is above the dielectric material 108 in the first inter-metal region 104. The resistive metallic film 122 is formed above the dielectric material 108 in the first inter-metal region 104. At this stage, the conductive layer 114, the metal layer 106, and the conductive film 118 may provide a "dual" MIM capacitor, in which the first dielectric layer 110 is between the conductive layer 114 and the metal layer 106, and the second dielectric layer 116 is between the conductive layer 114 and the conductive film 118. The dual MIM capacitor may offer a capacitance density that is two times higher than the single MIM capacitor.

Figure 7:
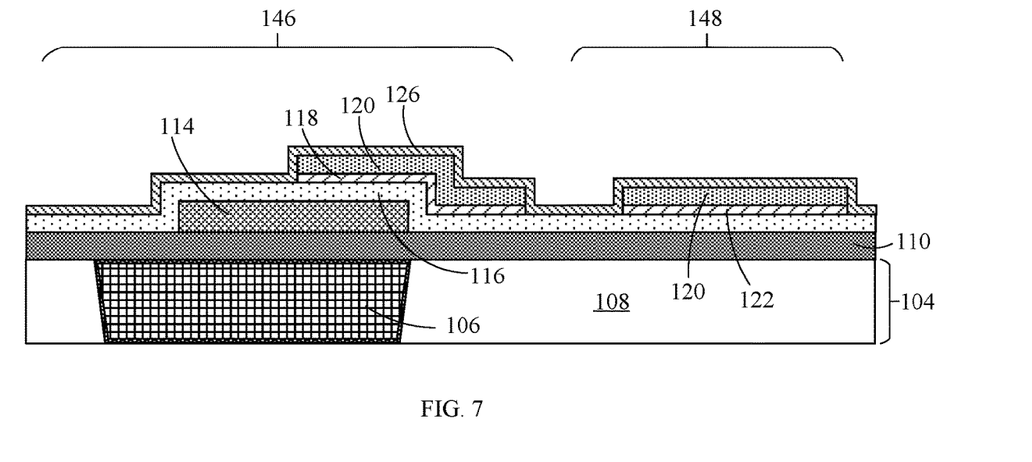

Referring to FIG. 7, a fourth dielectric layer 126 may be formed using a conformal deposition process, such as an ALD process or a highly conformal CVD process. As described herein, the fourth dielectric layer 126 may function as a protective barrier and may be deposited over the capacitor and the resistor. For example, the fourth dielectric layer 126 may be deposited on the conductive film 118, the third dielectric layer 120, the resistive metallic film 122, and the second dielectric layer 116.

Figure 8:
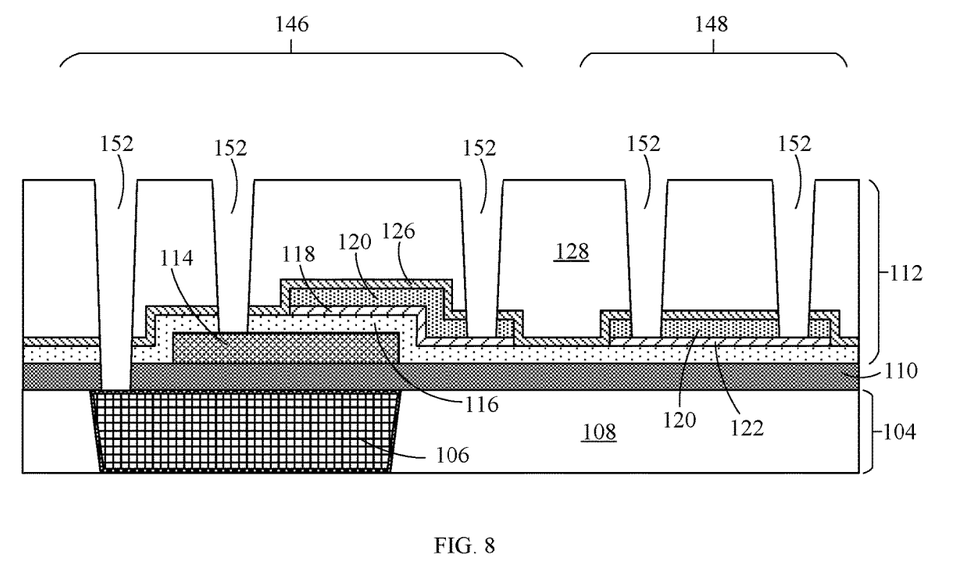

Referring to FIG. 8, a second inter-metal region 112 may be formed above the first inter-metal region 104. The second inter-metal region 112 may be formed by depositing a dielectric material 128 on the fourth dielectric layer 126 using the deposition techniques described herein. The deposited dielectric material 128 may be patterned to define via openings 152 using the patterning techniques described herein. A mask may be used in the patterning process to form the via openings 152. As shown, the via openings 152 in the capacitor region 146 exposes the metal layer 106, the conductive layer 114, the conductive film 118, and the via openings 152 in the resistor region 148 exposes the resistive metallic film 122.

Figure 9:
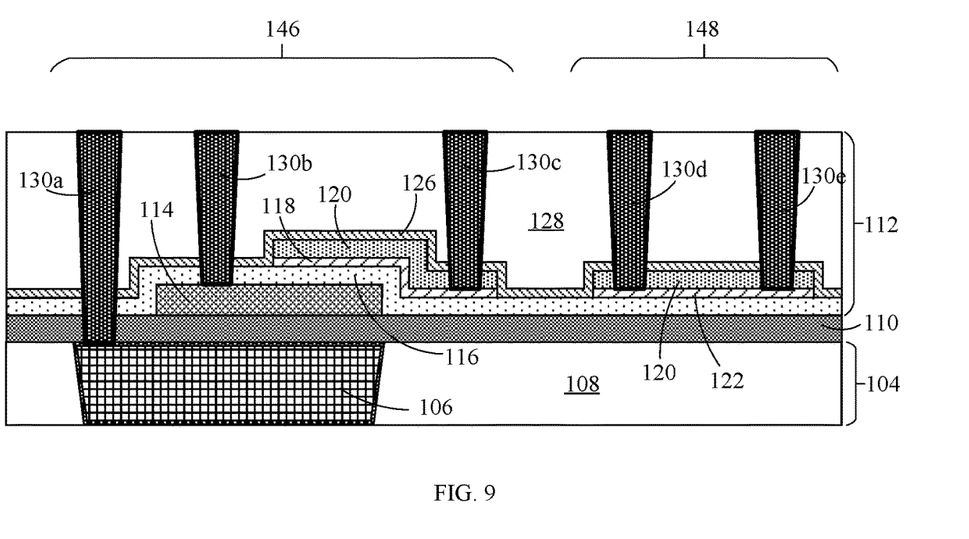

Referring to FIG. 9, interconnect vias 130a, 130b, 130c, 130d, 130e may be formed in the via openings 152, for example, using a damascene process. As shown, interconnect vias 130a, 130b, 130c may be formed in the capacitor region 146, in which the first interconnect via 130a may be formed on the metal layer 106, the second interconnect via 130b, may be formed on the conductive layer 114, and the third interconnect via 130c may be formed on the second horizontal section of the conductive film 118. In the resistor region 148, the fourth interconnect via 130d, and the fifth interconnect via 130e may be formed on the resistive metallic film 122. A chemical mechanical planarization (CMP) step may be performed thereafter to planarize the upper surfaces of the interconnect vias 130a, 130b, 130c, 130d, 130e.

To form the embodiment shown in FIG. 1A, the structure shown in FIG. 9 may be subjected to further processing. A third inter-metal region 134 may be formed above the second inter-metal region 112, in which the third inter-metal region 134 includes conductive lines 138a, 138b, 138c, 138d, 138e for connection with the interconnect vias 130a, 130b, 130c, 130d, 130e. For example, a fifth dielectric layer 132 may be deposited on the dielectric material 128 in the second inter-metal region 112, and a dielectric material 136 may be deposited on the fifth dielectric layer 132. The dielectric material 136 may be patterned to form openings, and the conductive lines 138a, 138b, 138c, 138d, 138e may be formed in the openings using a damascene process.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, non-volatile (NV) memory devices, FinFET transistor devices, CMOS devices, etc.

What is claimed is:

1. A semiconductor device comprising:
   a first inter-metal region above a substrate;
   a second inter-metal region above the first inter-metal region;
   a capacitor comprising:
      a metal layer in the first inter-metal region;
      a conductive layer in the second inter-metal region, the conductive layer is above the metal layer;
      a first dielectric layer between the metal layer and the conductive layer;
      a conductive film in the second inter-metal region, the conductive film has a first horizontal section above the conductive layer and a second horizontal section laterally adjacent to the conductive layer;
      a second dielectric layer between the conductive layer and the conductive film;
      a first interconnect via disposed upon the metal layer; and
      a second interconnect via disposed upon the conductive layer.

2. The device of claim 1, further comprising:
   a third interconnect via disposed upon the second horizontal section of the conductive film.

3. The device of claim 2, wherein the conductive layer includes a side surface, the conductive film includes a vertical section, and the vertical section of the conductive film overlaps with the side surface of the conductive layer.

4. The device of claim 3, wherein the first horizontal section of the conductive film is integrally joined to the second horizontal section of the conductive film by the vertical section of the conductive film.

5. The device of claim 4, wherein the conductive layer further includes an upper surface, and the first horizontal section of the conductive film overlaps with the upper surface of the conductive layer.

6. The device of claim 4, wherein the first inter-metal region includes a dielectric material, and the second horizontal section of the conductive film is above the dielectric material in the first inter-metal region.

7. The device of claim 6, wherein the first dielectric layer and second dielectric layer extend to lie below the second horizontal section of the conductive film.

8. The device of claim 6, further comprising a resistor, the resistor comprising a resistive metallic film in the second inter-metal region, wherein the resistive metallic film of the resistor and the conductive film of the capacitor are a same material.

9. The device of claim 8, wherein the resistive metallic film is above the dielectric material in the first inter-metal region.

10. The device of claim 9, wherein the first dielectric layer and the second dielectric layer extend to lie below the resistive metallic film.

11. A semiconductor device comprising:
a first inter-metal region above a substrate;
a second inter-metal region above the first inter-metal region;
a capacitor comprising:
  a metal layer in the first inter-metal region;
  a conductive layer in the second inter-metal region, the conductive layer is above the metal layer;
  a first dielectric layer between the metal layer and the conductive layer;
  a conductive film in the second inter-metal region, the conductive film has a first horizontal section above the conductive layer and a second horizontal section laterally adjacent to the conductive layer;
  a second dielectric layer between the conductive layer and the conductive film; and
a resistor comprising:
  a resistive metallic film in the second inter-metal region, wherein the resistive metallic film of the resistor and the conductive film of the capacitor are a same material.

12. The device of claim 11, further comprising
a first interconnect via disposed upon the metal layer;
a second interconnect via disposed upon the conductive layer; and
a third interconnect via disposed upon the second horizontal section of the conductive film.

13. The device of claim 12, wherein the first inter-metal region includes a dielectric material, and the second horizontal section of the conductive film is above the dielectric material in the first inter-metal region.

14. The device of claim 12, wherein the first dielectric layer is disposed upon the metal layer and the dielectric material in the first inter-metal region, the first dielectric layer extends to lie below the resistive metallic film and the second horizontal section of the conductive film.

15. The device of claim 14, wherein the second dielectric layer is disposed upon the conductive layer and the first dielectric layer, the second dielectric layer extends to lie below the resistive metallic film and the second horizontal section of the conductive film.

16. A method of forming a resistor and a capacitor in a semiconductor device, the method comprising:
providing a first inter-metal region above a substrate, the first inter-metal region having a dielectric material;
forming a metal layer in the first inter-metal region;
forming a first dielectric layer on the metal layer;
forming a conductive layer on the first dielectric layer;
forming a second dielectric layer on the conductive layer;
forming a conductive film on the second dielectric layer, the conductive film has a first horizontal section above the conductive layer and a second horizontal section laterally adjacent to the conductive layer;
forming a resistive metallic film above the dielectric material in the first inter-metal region, wherein the resistive metallic film and the conductive film are made of a same material; and
forming a second inter-metal region above the first inter-metal region, wherein the conductive layer, the conductive film, and the resistive metallic film are in the second inter-metal region.

17. The method of claim 16, further comprising
forming a first interconnect via on the metal layer;
forming a second interconnect via on the conductive layer; and
forming a third interconnect via on the second horizontal section of the conductive film.

18. The method of claim 17, wherein the first dielectric layer is formed on the dielectric material in the first inter-metal region.

19. The method of claim 17, wherein the conductive film and the resistive metallic film are formed simultaneously.

20. The method of claim 19, wherein the second horizontal section of the conductive film is formed above the dielectric material in the first inter-metal region.

* * * * *